(12) United States Patent
Zhang et al.

(10) Patent No.: US 11,881,405 B2
(45) Date of Patent: Jan. 23, 2024

(54) METHODS FOR FORMING N-TYPE BURIED LAYER IN A SUBSTRATE BY PERFORMING NON-DOPING IMPLANT THROUGH OXIDE LAYER FORMED OVER THE SUBSTRATE

(71) Applicant: Applied Materials, Inc., Santa Clara, CA (US)

(72) Inventors: Qintao Zhang, Mt Kisco, NY (US); Wei Zou, Lexington, MA (US)

(73) Assignee: Applied Materials, Inc., Santa Clara, CA (US)

( * ) Notice: Subject to any disclaimer, the term of this patent is extended or adjusted under 35 U.S.C. 154(b) by 37 days.

(21) Appl. No.: 17/592,617

(22) Filed: Feb. 4, 2022

(65) Prior Publication Data

US 2023/0253208 A1 Aug. 10, 2023

(51) Int. Cl.
*H01L 21/265* (2006.01)
*H01L 21/266* (2006.01)

(52) U.S. Cl.
CPC ...... *H01L 21/26513* (2013.01); *H01L 21/266* (2013.01); *H01L 21/26533* (2013.01)

(58) Field of Classification Search
CPC ......... H01L 21/26513; H01L 21/26533; H01L 21/266
USPC ........................................................ 438/526
See application file for complete search history.

(56) References Cited

U.S. PATENT DOCUMENTS

| 5,476,800 A | * | 12/1995 | Burton | .................... H01L 21/74 438/526 |
| 5,587,325 A | | 12/1996 | Comeau | |
| 10,243,048 B2 | | 3/2019 | Hu et al. | |

OTHER PUBLICATIONS https://www.iue.tuwien.ac.at/phd/puchner/node48_app.html; Downloaded Dec. 11, 2021, 5 pages.
https://www.iue.tuwien.ac.at/phd/puchner/node47_app.html; 2 pages.
Characterization of ion implanted antimony, Michael J Cumbo, RIT dissertation, 1987, 107 pages.
Characterization of LOCOS Field Oxide on 4H-SiC Formed by Ar Preamorphization Ion Implantation, dated Apr. 25, 2017, INSPEC Accession No. 16899072, DOI: 10.1109/LED.2017.2698018, XX pages.

* cited by examiner

*Primary Examiner* — Quoc D Hoang
(74) *Attorney, Agent, or Firm* — KDW Firm PLLC

(57) ABSTRACT

Disclosed herein are approaches for reducing buried channel recess depth using a non-doping ion implant prior to formation of the buried channel. In one approach, a method may include providing an oxide layer over a substrate, performing a non-doping implantation process through the oxide layer to form an amorphous region in the substrate, and forming a photoresist over the oxide layer. The method may further include forming a buried layer in the substrate by implanting the substrate through an opening in the photoresist, and performing an oxidation and dopant drive-in process to the amorphous region and to the buried layer to form a second oxide layer.

18 Claims, 4 Drawing Sheets

METHODS FOR FORMING N-TYPE BURIED LAYER IN A SUBSTRATE BY PERFORMING NON-DOPING IMPLANT THROUGH OXIDE LAYER FORMED OVER THE SUBSTRATE

FIELD OF THE DISCLOSURE

The present embodiments relate to semiconductor device patterning, and more particularly, to approaches for reducing buried channel recess depth using a non-doping ion implant.

BACKGROUND OF THE DISCLOSURE

A microelectronic device with analog components may have a doped n-type buried layer (NBL). Antimony is one type of dopant for the NBL due to its low diffusion coefficient and high dopant density. The NBL is commonly formed by starting with a p-type silicon substrate, and growing a thick layer of oxide atop the surface of the substrate. A photoresist mask is patterned over the thick oxide, exposing the area for the NBL. The thick oxide is etched away in the area for the NBL, exposing the silicon, after which the photoresist mask is removed. Antimony may then be implanted into the silicon, and an additional thermal oxide is grown on the substrate, usually during a temperature ramp preceding an anneal/dopants drive-in step.

Growing the additional thermal oxide with the thick oxide in place results in a recess in the top surface of the substrate, because the silicon in the implanted area is consumed faster than that in the un-implanted area by the oxide growth, while the silicon under the thick oxide is consumed at a much lower rate. The anneal/dopants drive-in step anneals the substrate and activates and diffuses the antimony deeper into the substrate, to form a part of the NBL. The oxide is subsequently removed from the top surface of the substrate, leaving the silicon recess over the NBL area. However, the recess over the NBL area can be significant in some cases, particularly when implantation dose is increased. This increased recess depth relative to the top surface of silicon is transferred to subsequently formed layers, which ultimately impacts transistor performance.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include providing an oxide layer over a substrate, performing a non-doping implantation process through the oxide layer to form an amorphous region in the substrate, and forming a photoresist over the oxide layer. The method may further include forming a buried layer in the substrate by implanting the substrate through an opening in the photoresist, and oxidizing the amorphous region and the buried layer to form a second oxide layer in the substrate and in the buried layer.

In another aspect, a method of forming an n-type buried layer (NBL) may include providing an oxide layer over a substrate, performing a non-doping implantation process through the oxide layer to form an amorphous region in the substrate, and forming a photoresist over the oxide layer. The method may further include forming the NBL in the substrate by implanting the substrate through an opening in the photoresist and in the oxide layer, performing an oxidation and dopant drive-in process to the amorphous region and to the buried layer to form a second oxide layer, and removing the second oxide layer.

In yet another aspect, a method may include depositing an oxide layer over a substrate, performing a non-doping implantation process through the oxide layer to form an amorphous region in the substrate, and forming a photoresist over the oxide layer. The method may further include forming an opening through the oxide layer and through the photoresist, implanting an exposed surface of the substrate to form a buried layer in the substrate, and removing the photoresist and the oxide layer from over the amorphous region and the buried layer. The method may further include performing an oxidation and dopant drive-in process to the amorphous region and to the buried layer to form a second oxide layer over the substrate and over the buried layer.

BRIEF DESCRIPTION OF THE DRAWINGS

The accompanying drawings illustrate exemplary approaches of the disclosure, including the practical application of the principles thereof, as follows.

Figure 1:
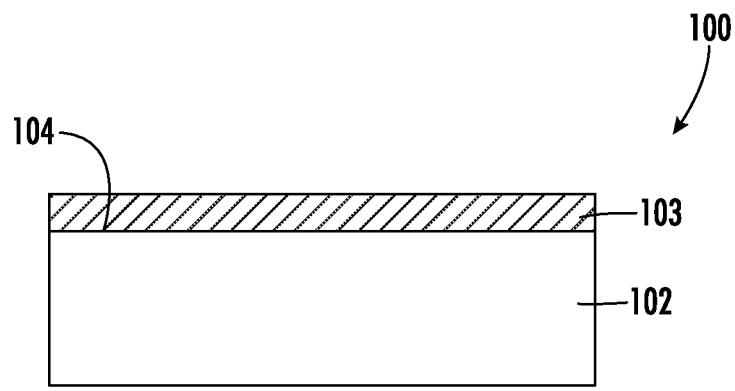
FIG. 1 is a cross-sectional side view of layers of a device, according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where various embodiments are shown. The methods and devices may be embodied in many different forms and are not to be construed as being limited to the embodiments set forth herein. Instead, these embodiments are provided so the disclosure will be thorough and complete, and will fully convey the scope of the methods to those skilled in the art.

Embodiments described herein advantageously provide a process to control NBL (N-type buried layer) recess height by performing a non-dopant implant (e.g., pre-amorphous implant (PAI)) prior to forming the buried layer and without changing any other typical processing parameters, such as oxidation, dopant activation, and ion diffusion. Although non-limiting, the non-dopant implant can be implemented on a high-current (HC) system or a medium current and high-doping system, depending on the desired screen oxide thickness.

FIG. 1 is a side cross-sectional view of a semiconductor/microelectronic device (hereinafter "device") 100, according to one or more embodiments described herein. The device 100 may include a device structure having a substrate 102 and an oxide layer 103 formed over the substrate 102. In some embodiments, the substrate 102 may include, for example, a bulk silicon wafer, a silicon-on-insulator (SOI) wafer, a silicon wafer with an epitaxial layer, or other substrate suitable for forming the device 100. Material of the substrate 102 may include silicon that is doped p-type, for example, by boron. The material of the substrate 102 may include silicon of a bulk silicon wafer, may include silicon of an epitaxial layer, or may include silicon of a transfer layer. Embodiments herein are not limited in this context.

Although non-limiting, the oxide layer 103 may be formed along a top surface 104 of the substrate 102 using a screen oxide deposition process. In some embodiments, the oxide layer 103 may be a uniform or non-uniform layer of silicon oxide ($SiO_2$) or other oxide layer(s), such as silicon dioxide. The oxide layer 103 may have a thickness range of, for example, 6.5 nanometers to 30 nanometers after being formed.

Figure 2:
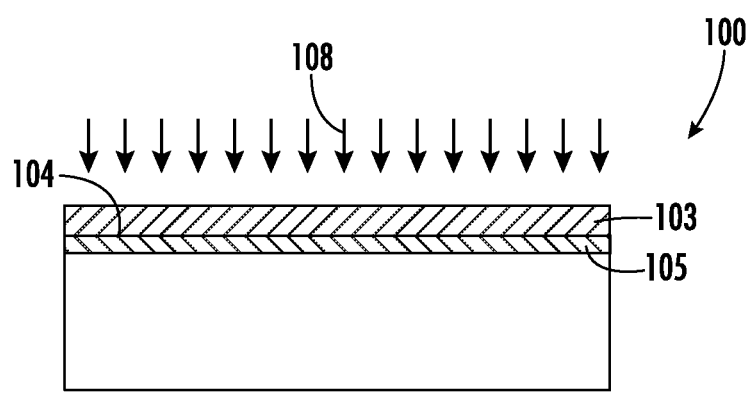
FIG. 2 is a side cross-sectional view illustrating the device during a non-dopant implant, according to embodiments of the present disclosure.

As demonstrated in FIG. 2, a non-dopant implantation process 108 may be performed through the oxide layer 103 to form an amorphous region 105 in the substrate 102. As shown, the amorphous region 105 may be formed generally along the top surface 104 of the substrate 102. The non-dopant implantation process 108 may be a pre-amorphization implantation process in which ions bombard the top surface 104 of the substrate 102 to perturb the crystalline lattice of the material. Ions of germanium (Ge), antimony (Sb), indium (In), silicon (Si), argon (Ar), fluorine (F) and xenon (Xe) are examples of pre-amorphizing agents that can be used in a pre-amorphization implantation process because they are generally heavier molecules. In addition to perturbing the crystalline lattice of the substrate 102, the ions amorphize the top surface 104 of the material. Both energy and dose can be adjusted/optimized to generate a desired thickness or depth for the amorphous region 105.

Figure 3:
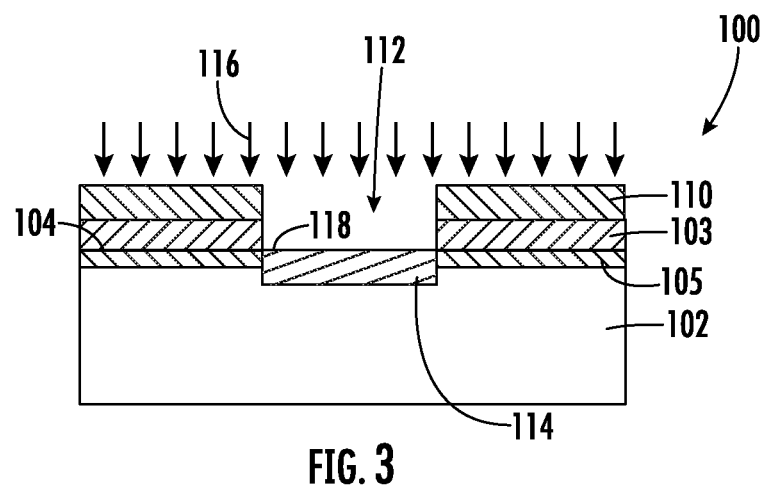
FIG. 3 is a side cross-sectional view illustrating the device during formation of a buried layer, according to embodiments of the present disclosure.

Next, as shown in FIG. 3, a photoresist 110 may be formed over the oxide layer 103 and then patterned (e.g., etched) to form an opening 112 therein. A buried layer 114 may then be formed in the substrate 102 by performing an ion implantation 116 through the opening 112. In some embodiments, the buried layer 114 is an n-type buried layer formed by directing one or more of the following ion species into the exposed top surface 104 of the substrate 102: antimony, phosphorous, boron, indium, and difluoroboron. As shown, a top surface 118 of the buried layer 114 may be generally co-planar with the top surface 104 of the substrate 102. In the case the buried layer 114 is formed by antimony, the previous pre-amorphization implantation process will not impact the antimony dopant profile because the antimony implant will also amorphize the substrate 102.

Figure 4:
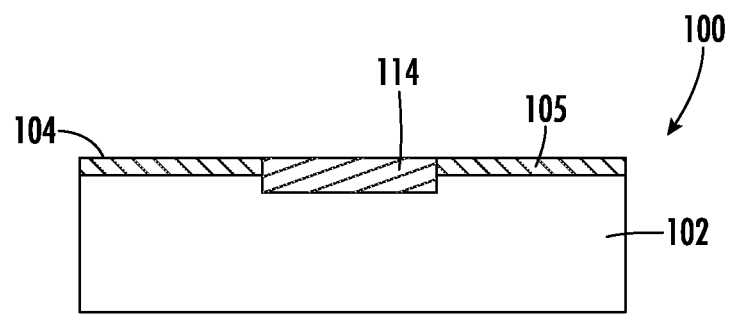
FIG. 4 is a side cross-sectional view illustrating the device following removal of an oxide layer and photoresist, according to embodiments of the present disclosure.

As shown in FIG. 4, the oxide layer 103 and the photoresist 110 may be removed from over the amorphous region 105. In some embodiments, the oxide layer 103 and the photoresist 110 may be removed selective to the amorphous region 105. For example, the removal process may be a wet etch, which includes an aqueous solution of dilute buffered hydrofluoric acid. Other methods of removing the oxide layer 103 and the photoresist 110 are within the scope of the present embodiments.

Figure 5:
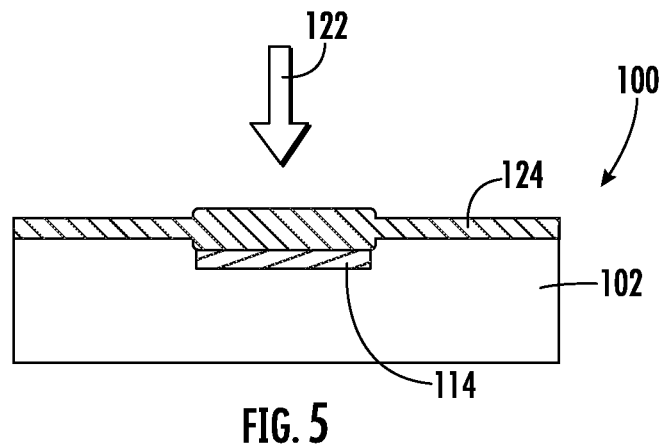
FIG. 5 is a side cross-sectional view illustrating formation of another oxide layer over the device, according to embodiments of the present disclosure.
Figure 6:
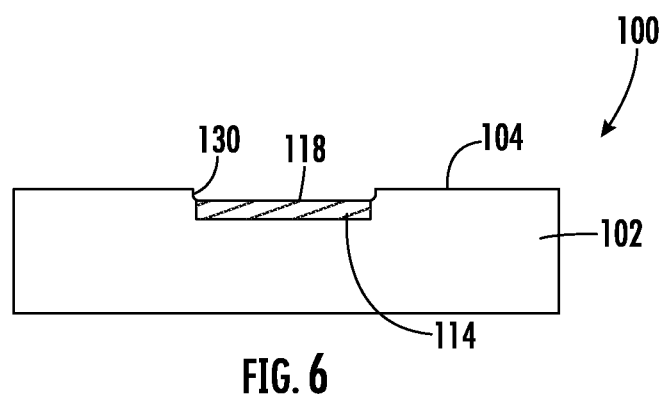
FIG. 6 is a side cross-sectional view illustrating the device following removal of the another oxide layer according to embodiments of the present disclosure.

As shown in FIG. 5, an oxidation and dopant drive-in process 122 may be performed to the amorphous region 105 (FIG. 4) and to the buried layer 114 to form a second oxide layer 124. In some embodiments, the oxidation and dopant drive-in process 122 may include a thermal treatment, such as a ramp thermal oxidation process, which is part of an anneal/diffusion process to anneal the amorphous region 105 and the buried layer 114. In other embodiments, the thermal treatment may be low temperature thermal annealing, rapid thermal annealing, spike annealing, flash annealing or laser annealing step. Advantageously, the amorphous or partially amorphous silicon of the amorphous region 105 oxidizes at a higher rate than single-crystal silicon of the substrate. The second oxide layer 124 may thus form at a higher rate in the areas adjacent the buried layer 114, resulting in a thicker and deeper second oxide layer 124. As a result, once the second oxide layer 124 is removed, as shown in FIG. 6, a smaller recess step 130 at a lateral boundary of the buried layer 114 may be achieved. Said differently, a distance between a plane defined by the top surface 104 of the substrate and a plane defined by the top surface 118 of the buried layer 114 can be minimized. Although non-limiting, the silicon recess step 130 may be less than 5 nanometers. By reducing the recess step 130, a more uniform epitaxy thickness may be achieved during subsequent processing steps.

Figure 7:
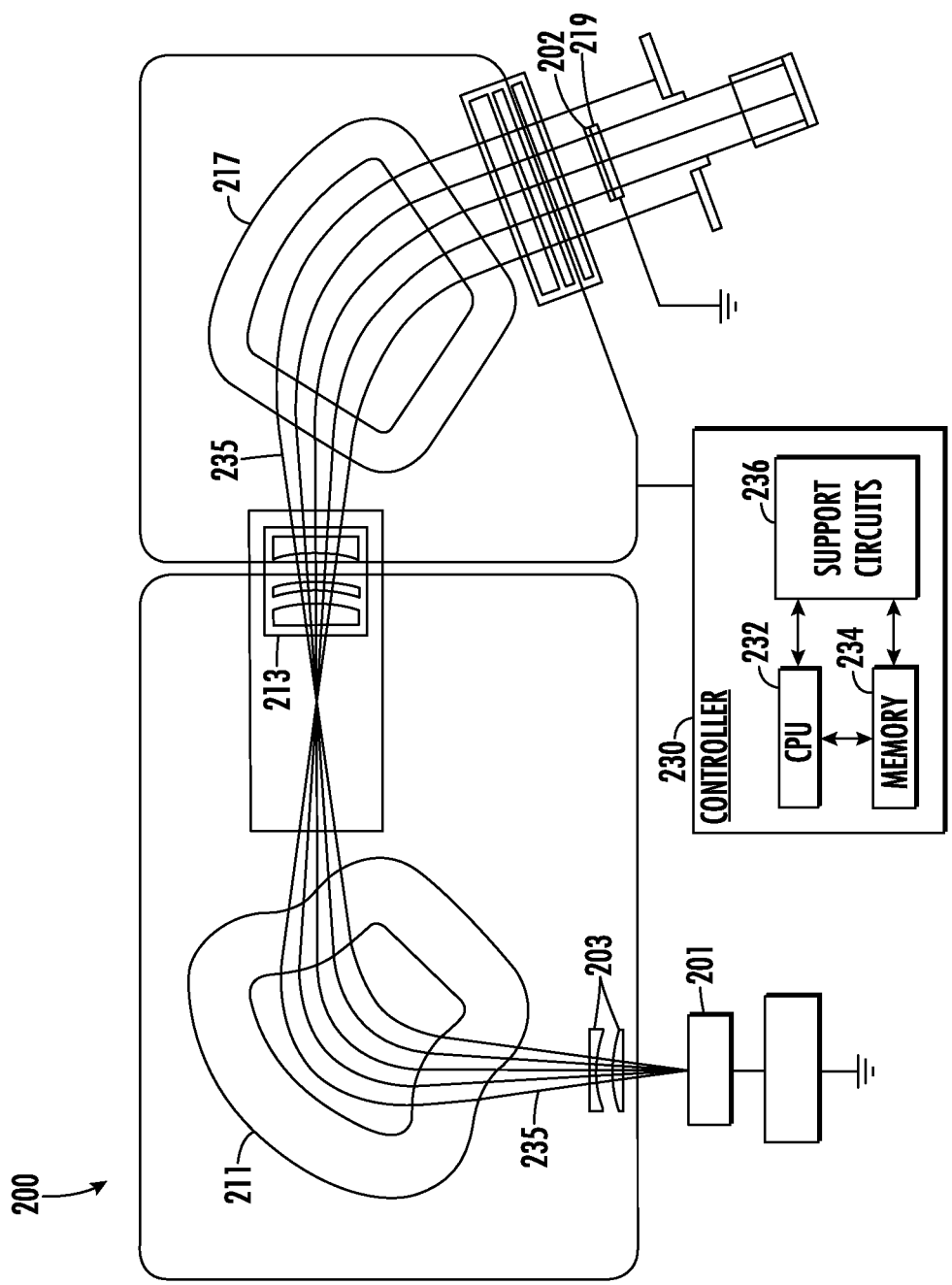
FIG. 7 illustrates a schematic diagram of a processing apparatus according to embodiments of the present disclosure.

FIG. 7 illustrates a schematic diagram of a processing apparatus 200 useful to perform processes described herein. One example of a beam-line ion implantation processing apparatus is the Varian VIISTA® Trident, available from Applied Materials Inc., Santa Clara, CA. The processing apparatus 200 may include an ion source 201 for generating ions. For example, the ion source 201 may provide an ion implant, such as the non-dopant implantation process 108 demonstrated in FIG. 2 and/or the ion implantation 116 demonstrated in FIG. 3. The ion source 201 may also provide an ion etch. The processing apparatus 200 may also include a series of beam-line components. Examples of beam-line components may include extraction electrodes 203, a magnetic mass analyzer 211, a plurality of lenses 213, and a beam parallelizer 217. The processing apparatus 200 may also include a platen 219 for supporting a substrate 202 to be processed. The substrate 202 may be the same as the substrate 102 described above. The substrate 202 may be moved in one or more dimensions (e.g. translate, rotate, tilt, etc.) by a component sometimes referred to as a "roplat" (not shown). It is also contemplated that the processing apparatus 200 may be configured to perform heated implantation processes to provide for improved control of implantation characteristics, such as the ion trajectory and implantation energy utilized to dope the substrate.

In operation, ions of the desired species, for example, dopant ions, are generated and extracted from the ion source 201. Thereafter, the extracted ions 235 travel in a beam-like state along the beam-line components and may be implanted in the substrate 202. Similar to a series of optical lenses that manipulate a light beam, the beam-line components manipulate the extracted ions 235 along the ion beam. In such a manner, the extracted ions 235 are manipulated by the beam-line components while the extracted ions 235 are directed toward the substrate 202. It is contemplated that the apparatus 200 may provide for improved mass selection to implant desired ions while reducing the probability of undesirable ions (impurities) being implanted in the substrate 202.

In some embodiments, the processing apparatus 200 can be controlled by a processor-based system controller such as controller 230. For example, the controller 230 may be configured to control beam-line components and processing parameters associated with beam-line ion implantation processes. The controller 230 may include a programmable central processing unit (CPU) 232 that is operable with a memory 234 and a mass storage device, an input control unit, and a display unit (not shown), such as power supplies, clocks, cache, input/output (I/O) circuits, and the like, coupled to the various components of the processing apparatus 200 to facilitate control of the substrate processing. The controller 230 also includes hardware for monitoring substrate processing through sensors in the processing apparatus 200, including sensors monitoring the substrate position and sensors configured to receive feedback from and control a heating apparatus coupled to the processing apparatus 200. Other sensors that measure system parameters such as substrate temperature and the like, may also provide information to the controller 230.

To facilitate control of the processing apparatus 200 described above, the CPU 232 may be one of any form of general-purpose computer processor that can be used in an industrial setting, such as a programmable logic controller (PLC), for controlling various chambers and sub-processors. The memory 234 is coupled to the CPU 232 and the memory 234 is non-transitory and may be one or more of readily available memory such as random access memory (RAM), read only memory (ROM), floppy disk drive, hard disk, or any other form of digital storage, local or remote. Support circuits 236 may be coupled to the CPU 232 for supporting the processor in a conventional manner. Implantation and other processes are generally stored in the memory 234, typically as a software routine. The software routine may also be stored and/or executed by a second CPU (not shown) that is remotely located from the hardware being controlled by the CPU 232.

The memory 234 is in the form of computer-readable storage media that contains instructions, that when executed by the CPU 232, facilitates the operation of the apparatus 200. The instructions in the memory 234 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the device 100, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
    providing an oxide layer over a substrate;
    performing a non-doping implantation process through the oxide layer to form an amorphous region in the substrate;
    forming a photoresist over the oxide layer;
    forming a buried layer in the substrate by implanting the substrate through an opening in the photoresist; and
    oxidizing the amorphous region and the buried layer to form a second oxide layer in the substrate and in the buried layer.

2. The method of claim 1, wherein the second oxide layer is formed over the substrate and over the buried layer.

3. The method of claim 1, further comprising removing the second oxide layer selective to the substrate and to the buried layer.

4. The method of claim 1, wherein the non-doping implantation process comprises a pre-amorphous implant (PAI).

5. The method of claim 3, wherein the PAI comprises implanting ions of germanium, antimony, indium, silicon, argon, fluorine, carbon, or xenon.

6. The method of claim 5, wherein the non-doping implantation process comprises a pre-amorphous implant (PAI) including at least one of the following ion species: germanium, antimony, indium, silicon, argon, fluorine, carbon, or xenon.

7. The method of claim 1, wherein the oxidation comprises thermally treating the amorphous region.

8. The method of claim 1, wherein implanting the substrate through the opening in the photoresist to form the buried layer comprises directing at least one of the following ion species into an exposed surface of the substrate: antimony, argon, phosphorous, boron, indium, and difluoroboron.

9. The method of claim 1, wherein buried layer is an n-type buried layer.

10. A method of forming an n-type buried layer (NBL), comprising:
    providing an oxide layer over a substrate;
    performing a non-doping implantation process through the oxide layer to form an amorphous region in the substrate;
    forming a photoresist over the oxide layer;
    forming the NBL in the substrate by implanting the substrate through an opening in the photoresist and in the oxide layer;
    performing an oxidation and dopant drive-in process to the amorphous region and to the NBL to form a second oxide layer; and
    removing the second oxide layer.

11. The method of claim 10, wherein the second oxide layer is formed over the substrate and over the NBL.

12. The method of claim 10, wherein the non-doping implantation process comprises a pre-amorphous implant (PAI).

13. The method of claim 12, wherein the PAI comprises implanting ions of germanium, antimony, indium, silicon, argon, fluorine, carbon, or xenon.

14. The method of claim 10, wherein the oxidation and dopant drive-in process comprises thermally treating the amorphous region.

15. The method of claim 10, wherein implanting the substrate through the opening in the photoresist to form the NBL comprises directing at least one of the following into an exposed surface of the substrate: antimony, argon, phosphorous, boron, indium, and difluoroboron.

16. A method, comprising:
    depositing an oxide layer over a substrate;
    performing a non-doping implantation process through the oxide layer to form an amorphous region in the substrate;
    forming a photoresist over the oxide layer;
    forming an opening through the oxide layer and through the photoresist;
    implanting an exposed surface of the substrate to form a buried layer in the substrate;
    removing the photoresist and the oxide layer from over the amorphous region and the buried layer; and
    performing an oxidation and dopant drive-in process to the amorphous region and to the buried layer to form a second oxide layer over the substrate and over the buried layer.

17. The method of claim 16, further comprising removing the second oxide layer selective to the substrate and to the buried layer.

18. The method of claim 16, wherein the oxidation and dopant drive-in process comprises thermally treating the amorphous region to increase oxidization of the amorphous region.

* * * * *